US006489245B1

United States Patent
Winniczek et al.

(10) Patent No.: US 6,489,245 B1
(45) Date of Patent: Dec. 3, 2002

(54) METHODS FOR REDUCING MASK EROSION DURING PLASMA ETCHING

(75) Inventors: Jaroslaw W. Winniczek, Daly City, CA (US); Vahid Vahedi, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 152 days.

(21) Appl. No.: 09/610,303

(22) Filed: Jul. 5, 2000

Related U.S. Application Data

(63) Continuation of application No. PCT/US99/02224, filed on Feb. 2, 1999, and a continuation of application No. 09/018,448, filed on Feb. 4, 1998, now Pat. No. 6,093,332.

(51) Int. Cl.[7] .......................................... H01L 21/302
(52) U.S. Cl. ................... 438/706; 438/710; 438/712; 438/720
(58) Field of Search ................. 438/706, 710, 438/712, 720; 176/345; 256/2, 69

(56) References Cited

U.S. PATENT DOCUMENTS

| 4,464,226 A | | 8/1984 | Karvinen et al. |
| 4,500,563 A | | 2/1985 | Ellenberger et al. |
| 4,889,588 A | * | 12/1989 | Fior ............................ 156/345 |
| 5,160,397 A | | 11/1992 | Doki et al. |
| 5,310,452 A | * | 5/1994 | Doki et al. ................. 156/345 |
| 5,468,341 A | | 11/1995 | Samukawa et al. |
| 5,614,060 A | * | 3/1997 | Hanawa |
| 5,683,538 A | * | 11/1997 | O'Neill et al. ............... 156/345 |

FOREIGN PATENT DOCUMENTS

| EP | 0140294 A | 5/1985 |
| EP | 0734046 A2 | 9/1996 |
| WO | WO97/14177 | 4/1997 |

OTHER PUBLICATIONS

IBM Technical Disclosure Bulletin, vol. 28, No. 4, Sep. 1985, pp. 1694–1696, EPO #XP–002076366.
Giffen, et al., "Silicon Dioxide Profile Control for Contacts and Vias", Solid State Technology (Apr., 1989) pp. 55–57.
PCT International Search Report, IPEA/EP.Jun. 26, 2000.

* cited by examiner

*Primary Examiner*—Benjamin L. Utech
*Assistant Examiner*—Lan Vinh
(74) *Attorney, Agent, or Firm*—Beyer Weaver & Thomas, LLP

(57) ABSTRACT

A method for reducing erosion of a mask while etching a feature in a first layer underlying the mask is disclosed. The first layer is disposed on a substrate, with the substrate being positioned on a chuck within in a plasma processing chamber. The method includes flowing an etchant source gas into the plasma processing chamber and forming a plasma from the etchant source gas. The method further includes pulsing an RF power source at a predefined pulse frequency to provide pulsed RF power to the chuck. The pulsed RF power has a first frequency and alternates between a high power cycle and a low power cycle at the pulse frequency. The pulse frequency is selected to be sufficiently low to cause polymer to be deposited on the mask during the low power cycle.

8 Claims, 5 Drawing Sheets

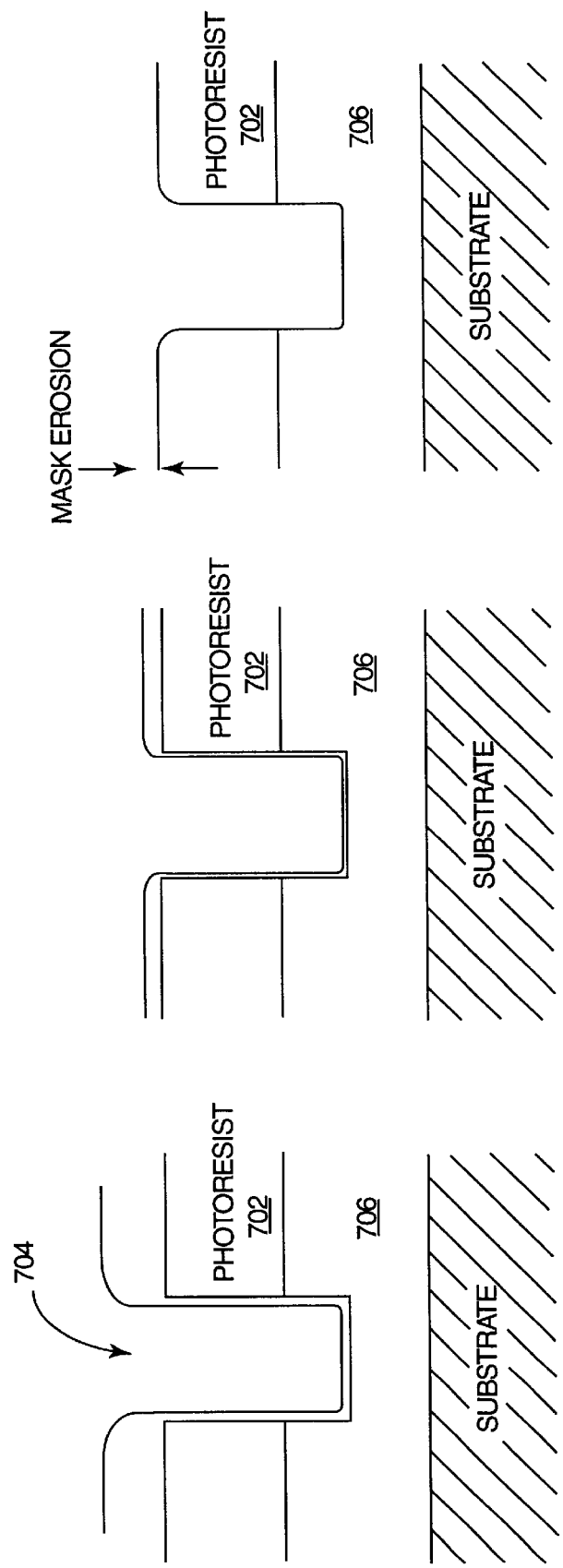

METHODS FOR REDUCING MASK EROSION DURING PLASMA ETCHING

CROSS REFERENCE TO RELATED APPLICATION

This is a Continuation application of prior application Ser. No. 90/018,448 filed on Feb. 4, 1998 now U.S. Pat. No. 6,093,332. International Application PCT/US99/02224 filed on Feb. 2, 1999, which designated the United States, the disclosure of which is incorporated herein by reference.

BACKGROUND OF THE INVENTION

The present invention relates to the fabrication of semiconductor integrated circuits (IC's). More particularly, the present invention relates to techniques for reducing mask erosion during the etching of features in a substrate layer.

During the manufacture of a semicoductor-based product, for example, a flat panel display or an integtrated circuit, multiple deposition and/or etching steps may be employed. During the deposition step, materials are deposited onto a substrate surface (such as the surface of a glass panel or a wafer). Conversely, etching may be employed to remove materials from predefined areas on the substrate surface.

During etching, a mask formed of a suitable mask material, such as photoresist, is typically employed to define the areas to be etched in the underlying layer. In an exemplary photoresist technique, the photoresist material is first deposited on the underlying layer to be etched. The photoresist material is then patterned by exposing the photoresist material in a suitable lithography system, and by developing the photoresist material to form a mask to facilitate subsequent etching. Using an appropriate etchant, areas of the underlying layer that are unprotected by the mask may then be etched away using an appropriate etchant source gas, thereby forming features such as trenches or vias in the underlying layer.

To facilitate discussion, FIG. 1 depicts an exemplary substrate stack 100, including mask 102, underlying layer 104, and substrate 106. As mentioned, mask 102 may represent photoresist mask or it may be formed of any suitable mask material, including hard mask materials. Underlying layer 106 represents the layer or layers to be etched. For ease of discussion, the underlying layer represents herein a dielectric layer (e.g. a doped or undoped silicon dioxide-containing layer) although depending on the specific application, the underlying layer may be formed of any etchable material, including for example polysilicon, metal, or the like. Substrate 104 includes the layers and features that underlie the layer to be etched and may include the semiconductor wafer or the glass panel itself. For the purposes of the invention herein, the composition of substrate 104 is somewhat irrelevant.

Within mask 102, there is shown an opening 108, which is created during the mask patterning process. Thought opening 108, etchants (or plasma formed from such etchants) react with the material of underlying layer 104 to etch features (e.g. vias or trenches) in the underlying layer.

In any given etch, the challenge has been to formulate an etch process that can achieve a high etch rate through the underlying layer while preserving the desired vertical etch profile and without causing undue damage to the protective mask. The latter consideration is particularly important because if the mask is inadvertently damaged during etching, the areas of the underlying layer that are disposed below the protective mask material may be undesirably etched away, leading to defects in the resultant semiconductor-based product.

To facilitate discussion of the mask erosion issue, FIG. 2 shows the etch result after substrate stack 100 is etched using a conventional plasma-enhanced etching process. As shown in FIG. 2, mask erosion causes some of mask 102 to be removed, as depicted by thickness 202. In the vicinity of opening 108 in mask 102, the mask material is eroded in both the vertical direction (which causes bulk loss 202) and in the horizontal direction to form facet 206. Although not shown in FIG. 2, excessive mask erosion may create a facet large enough to expose the underlying material of layer 104 to the etchant, leading to undesirable damage to underlying layer 104 in the vicinity of opening 108.

Mask erosion is an even greater challenge in the fabrication of modern high density integrated circuits. To achieve greater circuit density, modern integrated circuits are scaled with increasingly, narrower design rules. As a result, the minimum separation between adjacent devices on the integrated circuit has steadily descreased. By way of example, it is not uncommon to employ design rules as small as 0.18 microns or even smaller in the fabrication of some high density integrated circuits. As adjacent devices are packed more closely together, there is a limit on them maximum allowable thickness of the mask layer. This is because if the mask is unduly thick for a given design rule, it may not be possible to properly pattern the mask for etching, for example. As the mask layer becomes thinner and thinner to accommodate the narrow design rules of high density integrated circuits, mask selectivity becomes more and more important to prevent inadvertent mask erosion. Accordingly, there is a need for an etch process that can maximize the overall etch rate and mask selectivity while maintaining the desired substantially vertical etch profile.

SUMMARY OF THE INVENTION

The present invention relates, in one embodiment, to a method for reducing erosion of a mask while etching a feature in a first layer underlying the mask. The first layer is disposed on a substrate, with the substrate being positioned on a chuck within in a plasma processing chamber and forming a plasma from the etchant source gas into the plasma processing chamber and forming a plasma from the etchant source gas. The method further includes pulsing an RF power source at a predefined pulse frequency to provide pulsed RF power to the chuck. The pulsed RF power has a first frequency and alternates between a high power cycle and a low power cycle at the pulse frequency. The pulse frequency is selected to be sufficiently low to cause polymer to be deposited on the mask during the low power cycle.

In another embodiment, the invention relates to a method for improving photoresist selectivity while etching a via in a dielectric layer underlying a photoresist mask. The dielectric layer is disposed on a wafer, with the wafer being positioned on a chuck within in a plasma processing chamber. The method includes flowing an etchant source gas into the plasma processing chamber. The etchant source gas includes a fluorocarbon-containing gas and a substantially nonreactive gas. The method further includes providing a first RF power wave form to a first electrode associated with the plasma processing chamber. The method also includes forming a plasma from the etchant source gas. The etchant source gas including a flurocarbon-containing gas. There is also included providing a pulsed RF power wave form to the chuck. The pulsed RF power wave form has a first frequency and alternates between a high power cycle and a low power cycle at a pulse frequency. The maximum power level during the low power cycle and the pulse frequency are selected to cause polymer to be deposited on the mask during the low power cycle.

These and other advantages of the present invention will become apparent upon reading the following detailed descriptions and studying the various figures of the drawings.

BRIEF DESCRIPTION OF THE DRAWINGS

The present invention is illustrated by way of example, and not by way of limitation, in the figures of the accompanying drawings and in which like reference numerals refer to similar elements and in which:

To facilitate discussion of the mask erosion issue.

FIGS. 7–9 illustrate various etch results at various RF bias power settings.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a through understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, erosion of the mask is advantageously minimized by etching the substrate stack with pulsed RF bias power in a plasma processing system. The term "mask" herein encompasses all types of masking materials including, e.g., polysilicon, photoresist, hard mask materials, or the like. The etching takes place while the substrate is disposed on a chuck within the plasma processing chamber. The pulsed RF bias power, which has a predefined RF frequency, is supplied to the chuck and alternates between a high power level and a low power level at a predefined pulse frequency. By selecting the appropriate pulse frequency, duty cycle, and power levels to allow polymer deposition to occur on the mask surface while the pulsed RF bias power is in the low power cycle, overall mask erosion may be reduced. During the high power cycle, etching of the underlying layer takes place through openings in the mask. In one embodiment, etch profile may be improved by selecting the appropriate pulse frequency, duty cycle, and power levels during the high power cycle to preferably remove substantially all polymer deposited along the feature side walls and at the bottom of the etched feature.

It is contemplated that the mask erosion reduction technique of the present invention may be practiced in any suitable plasma processing system in which the RF power supply may be pulsed between a high power level and a low power level. By way of example, etching according to the present invention may be practiced in any of the known plasma processing apparatuses, including those adapted for dry etching, plasma etching, reactive ion etching (RIE), magnetically enhanced reactive ion etching (MERIE), or the like. This is true irrespective whether energy to the plasma is delivered through capacitively coupled parallel electrode plates, through electron cyclotron resonance (ECR) sources, microwave plasma sources, through inductively coupled RF sources such as helicon, helical resonators, and induction coils (whether or not planar). ECR and TCP-brand (transformer coupled plasma) plasma processing system, among others, are available from Lam Research Corporation of Fremont, Calif.

Figure 2:
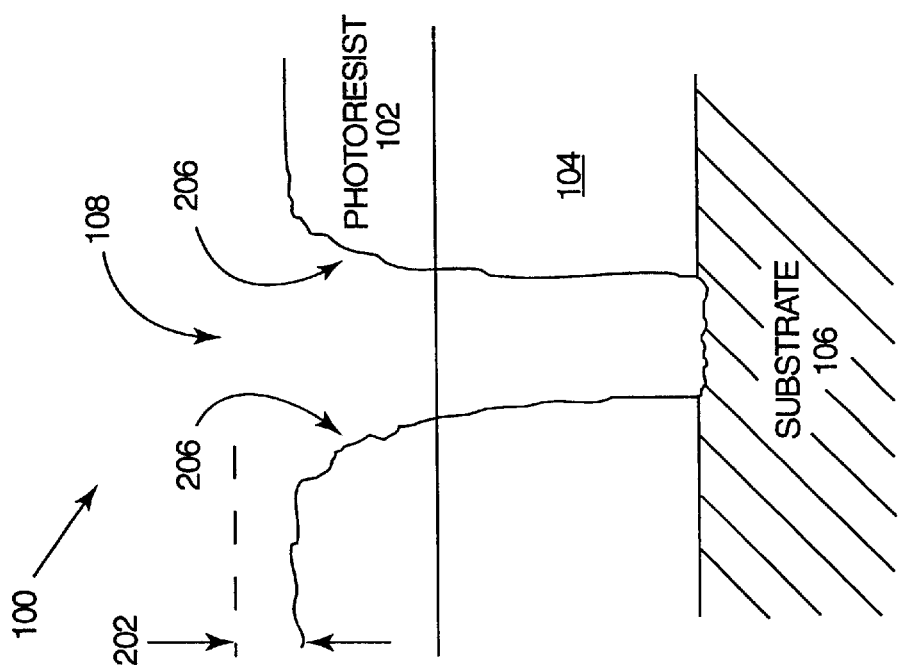
FIG. 2 shows the etch result after the substrate stack of FIG. 1 is etched using a conventional plasma-enhanced etching process.
Figure 1:
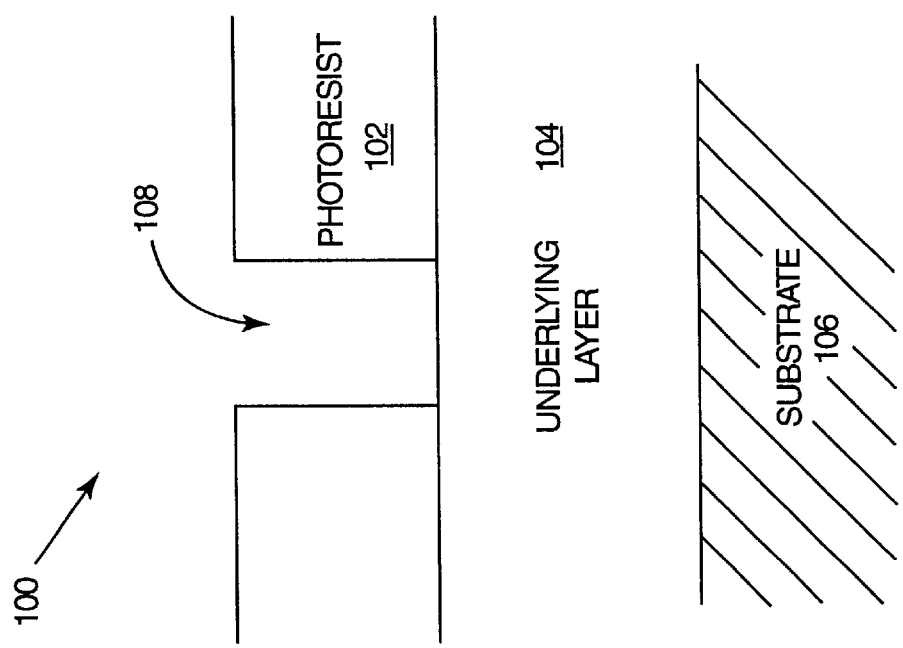
FIG. 1 depicts an exemplary substrate stack, including the mask, the underlying layer to be etched, and the substrate to facilitate discussion.
Figure 3:
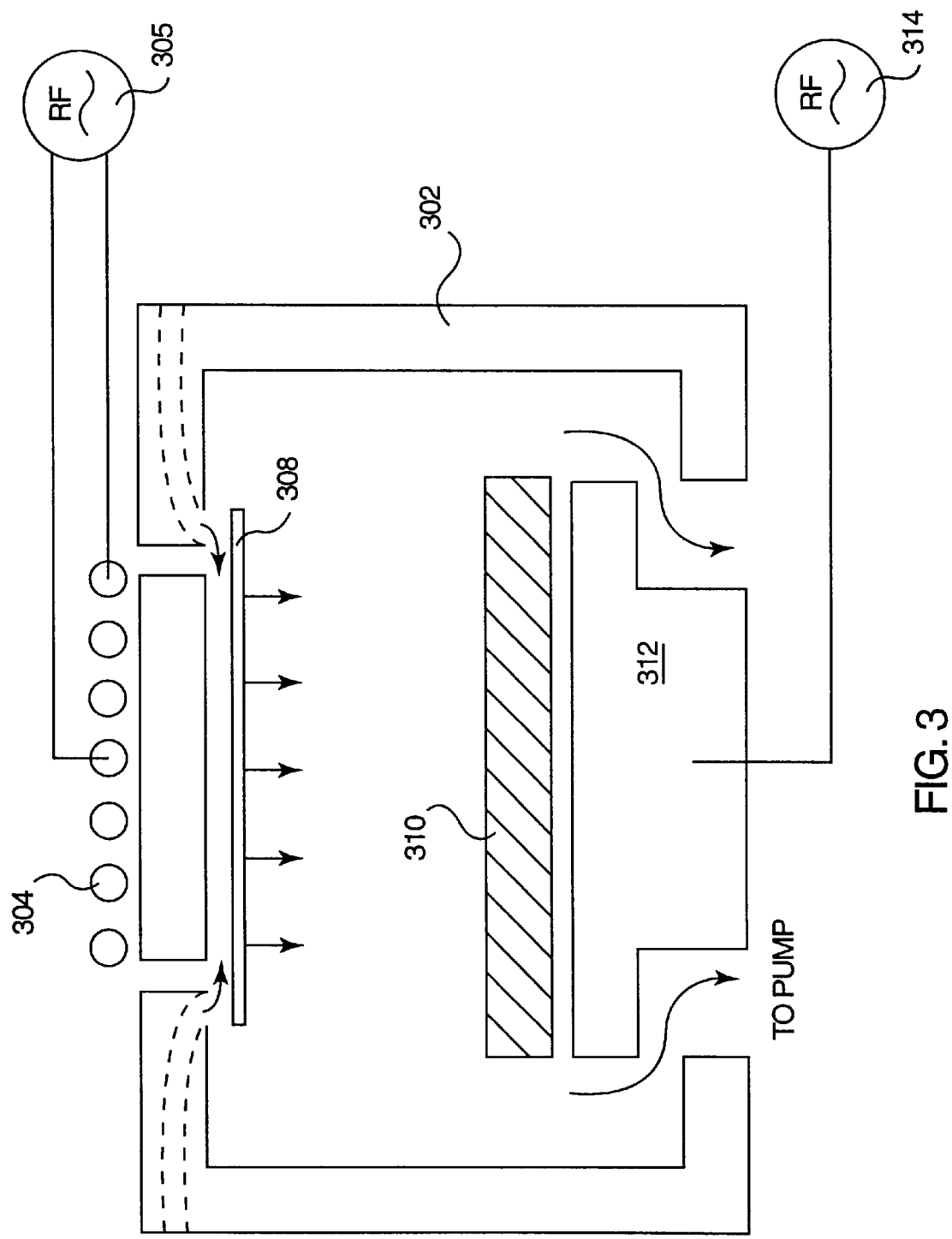
FIG. 3 illustrates a simplified schematic of the TCP™ 9100 plasma processing system, representing a plasma processing system suitable for practicing the invention.

In one embodiment, the present invention is practiced in a TCP™ 9100 low pressure, high density plasma reactor, which is available from Lam Research Corporation, although, as mentioned above, any other conventional and suitable plasma processing systems may well be employed. FIG. 3 illustrates a simplified schematic of the TCP™ 9100 plasma reactor 300, including a plasma processing chamber 302. Above chamber 302, there is disposed an electrode 304, which is implemented by an induction coil in the example of FIG. 3. Coil 304 is energized by a RF generator 306 via a matching network (not shown in FIG. 3). The RF power supplied to coil 304 may have an RF frequency of, for example, 13.56 MHz.

Within chamber 302, there is provided a gas distribution plate 308, which preferably includes a plurality of holes for distributing gaseous source materials, e.g., the etchant source gases, into the RF-induced plasma region between itself and a substrate 310. The gaseous source materials may also be released from ports built into the walls of the chamber itself. Substrate 310 is introduced into chamber 302 and disposed on a chuck 312, which acts as the bottom electrode and is preferably biased by a radio frequency generator 314 (also typically via a matching network). The RF energy supplied by RF generator 314 may have an RF frequency of, for example, 4 MHz although other RF frequencies may also be employed. Chuck 312 may represent any suitable work piece holder and may be implemented by, for example, an electrostatic (ESC) chuck, a mechanical-type chuck, a vacuum chuck, and the like. During plasma etching, the pressure within chamber 302 is preferably kept low, e.g., between about 1 and about 50 m Torr in one embodiment.

Figure 4:
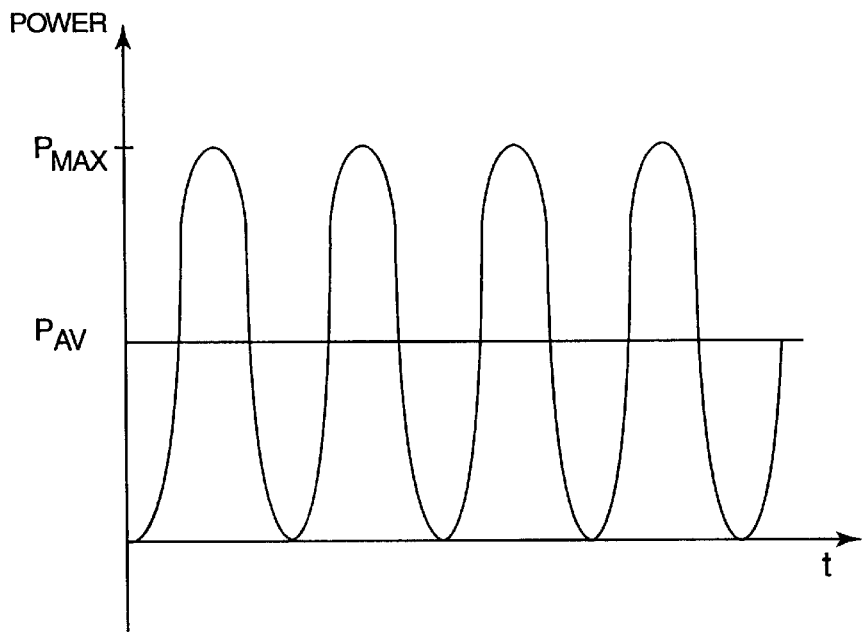
FIG. 4 depicts the prior art continuous RF power wave form.
Figure 5:
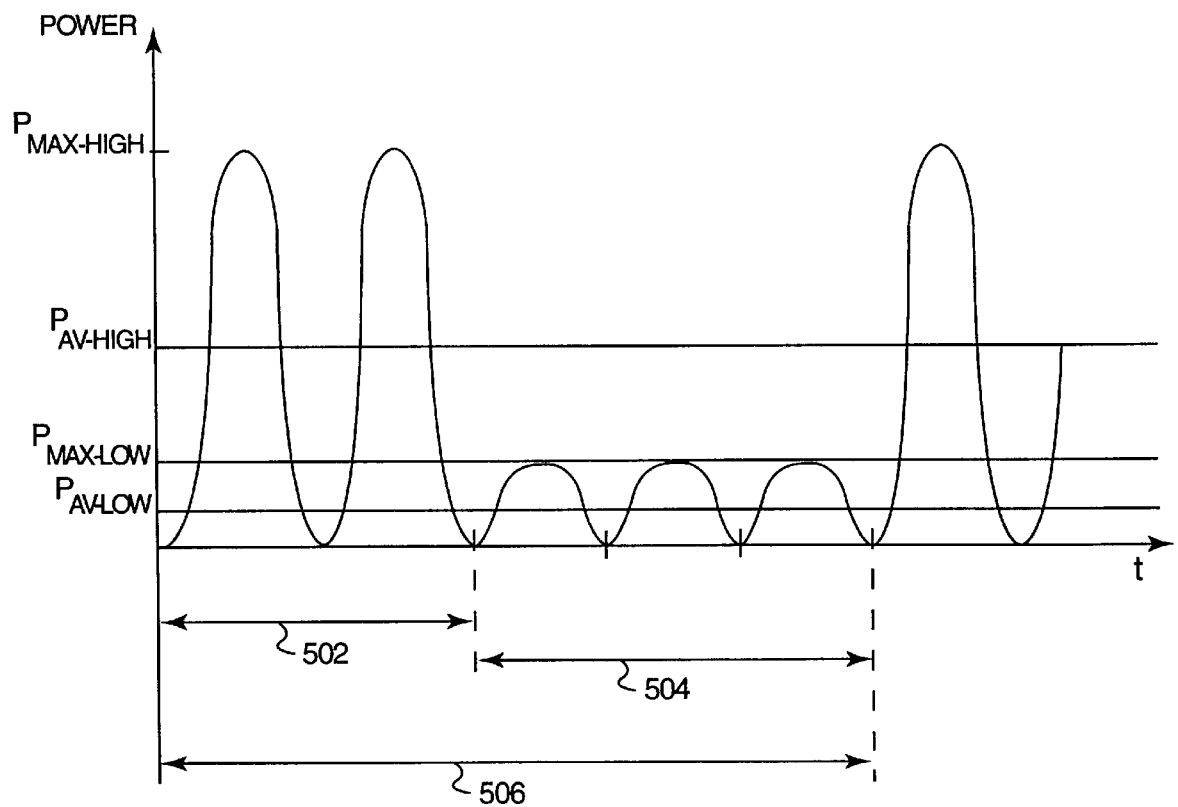
FIG. 5 depicts the pulsed RF power wave form, which is supplied to the chuck electrode to reduce mask erosion during etching.

In accordance with one aspect of the present invention, the RF bias power supplied to the bottom electrode, e.g., to chuck 312, is pulsed between a high power level and a low power level at a predefined pulse frequency in order to reduce mask erosion during etching. To facilitate discussion of the aspect of the present invention, FIGS. 4 and 5 depict the contrast between a continuous RF bias power wave form, such as that typically employed in the prior art etch, and the pulsed RF bias power wave form employed to reduce mask erosion in accordance with the present invention. With reference to FIG. 4, the prior art continuous RF power wave form has a predefined RF frequency, e.g., 4 MHz, a predefined maximum power level $P_{MAX}$, thereby yielding an average power level $P_{AV}$. The RF bias power wave form of prior art FIG. 4 is a deemed continuous since the amplitude of the wave form does not vary from the predefined maximum power level $P_{MAX}$ during etching.

In FIG. 5, the RF power is also supplied at a predefined RF frequency (although a constant RF frequency is not required by the invention). Unlike the continuous RF bias power wave form of prior art FIG. 4, however, the maximum amplitude of the RF bias power wave form of FIG. 5 alternates between a high power level $P_{MAX\text{-}HIGH}$ and a low power level $P_{MAX\text{-}LOW}$. Thus, during the low power cycle, the average power ($P_{AV\text{-}LOW}$) delivered to the chuck electrode is lower than the average power delivered to the chuck electrode during the high power cycle ($P_{AV\text{-}HIGH}$). The RF bias power wave form alternates between the low power level and the high power level at a predefined pulsed frequency $f_{PULSE}$, which is the inverse of the pulse period (506) shown. The duty cycle is defined by the ratio of the duration of the high power cycle (502) relative to the duration of the pulse period (506).

In accordance with one aspect of the present invention, the pulse frequency (i.e., the frequency at which the RF power supplied to the chuck electrode alternates between the high power level and the low power level) is selected to be sufficiently low to permit polymer to be deposited on the mask surface during the low power cycle. At the start of the high power cycle, this deposited polymer acts as a sacrificial layer to afford some protection to the underlying mask material. Accordingly, even if the entire thickness of the deposited polymer is eroded away during the high power cycle, less of the mask material is etched away since the presence of the deposited polymer at the start of the high power cycle reduces the amount of time the mask material is exposed to the etchant material during this high power level.

This aspect of the present invention flows from the recognition that in most plasma etching processes, two separate mechanisms are at work in competition against each other. Generally speaking, during the etching of an underlying layer, RF power supplied to the chuck electrodes causes ions from the plasma to be accelerated toward the substrate surface to etch away areas of the underlying layer that are exposed through openings in the mask. At the same time, polymer is deposited on the substrate, along the etch feature side wall, and along the bottom of the etched feature. The polymer deposition serves some useful functions, e.g., protecting the side wall from being attacked by the etchant during etching and preserving the etch profile.

Figure 6:
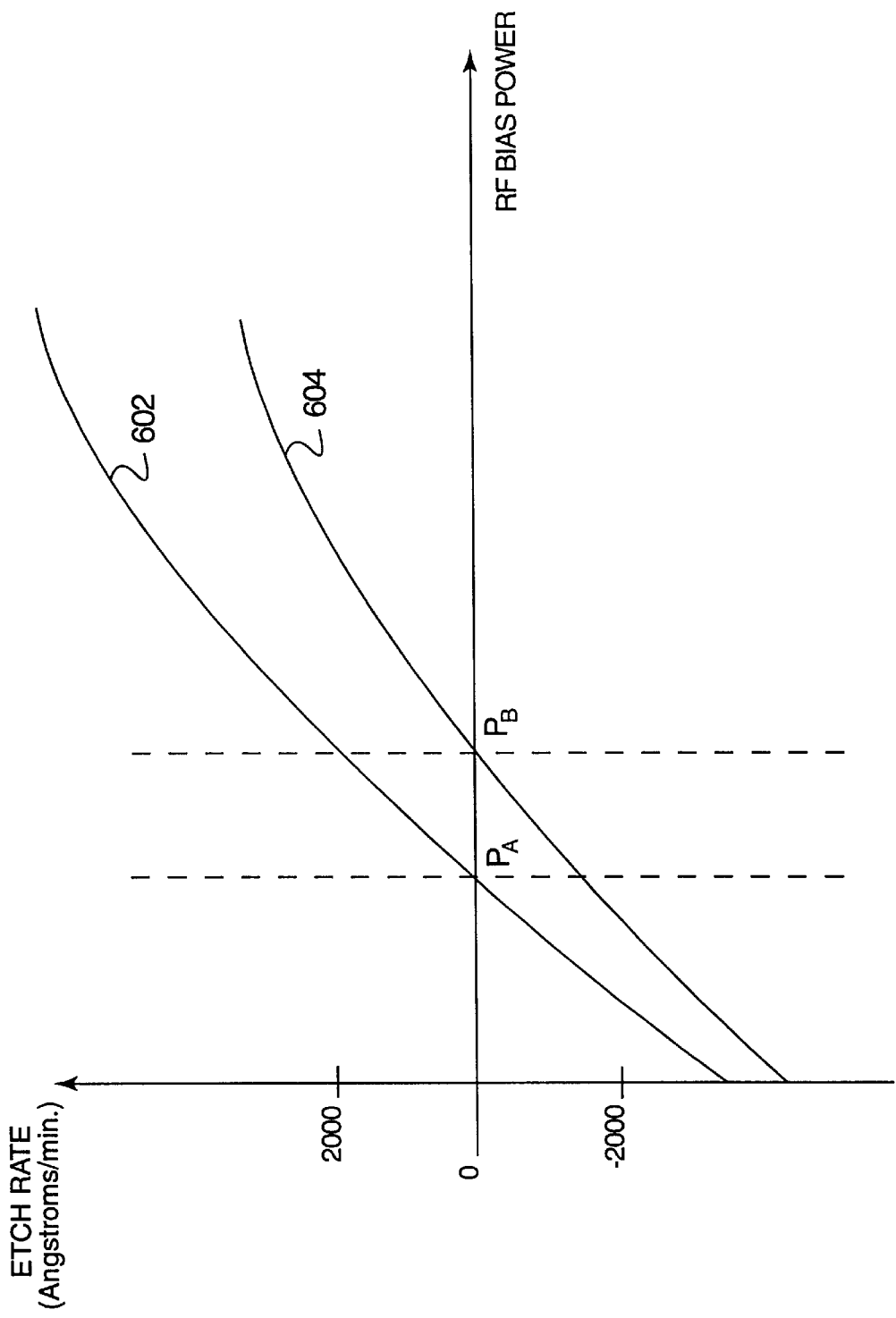
FIG. 6 depicts an exemplary plot of etch rates versus RF bias power for a hypothetical etching process to facilitate discussion of the competing mechanisms that exist during plasma etching.

Also speaking generally, if the Rf power supplied to the chuck electrode is decreased, polymer deposition tends to be increased and less mask erosion occurs (i.e., mask selectivity is increased). However, decreasing the RF power to the chuck electrode tends to disadvantageously reduce the overall etch rate as ion energy is reduced. To illustrate the effect of RF bias power on the etch rate or erosion rate of the photoresist mask and on the etch rate of the underlying layer, FIG. 6 depicts an exemplary plot of etch rates versus RF bias power for a hypothetical etching process. In FIG. 6, the RF power wave form is assumed to be continuous (i.e., not pulsed) for ease of understanding.

With reference to FIG. 6, curve 602 depicts the etch rate through the underlying layer (e.g., dielectric layer that underlies the mask). As shown in FIG. 6, etching of the underlying layer occurs when RF bias power is above the predefined value $P_A$. At the predefined value $P_A$, the etching mechanism and the polymer deposition mechanism cancel each other out, resulting in an etch rate of zero for underlying layer. Below the predefined value $P_A$, the polymer deposition mechanism becomes the dominant mechanism, and the polymer deposition is built up without etching of the underlying layer.

Curve 604 depict the etch rate or the erosion rate through the mask as a function of RF bias power. Erosion of the mask occurs when RF bias power is above a predefined value $P_B$. At the predefined value $P_B$, the etching mechanism and the polymer deposition mechanism cancel each other out, resulting in an erosion rate of zero for the mask. Below the predefined value $P_B$, the polymer deposition mechanism becomes the dominant mechanism and the polymer deposition is built up without erosion of the mask.

As shown in FIG. 6, etching of the underlying layer may still occur in the region between the values $P_A$ and $P_B$ while mask erosion is substantially minimized. However, if the continuous RF power is reduced so the etching occurs only in the regime, the etch rate is typically too low to be of practical value. Further, as the etch progresses and the feature becomes deeper and deeper, the etch rate at the bottom of the feature may actually slow down to the point where no etching of the underlying layer occurs as fewer and fewer ions reach the bottom of the etched feature. Accordingly, etching in accordance with prior art continuous RF power wave form technique typically employs a continuous RF bias power setting substantially higher than the value $P_B$ to increase the etch rate and/or to ensure that etching continues as the etch feature becomes deeper and deeper.

From these recognitions, it is realized that mask erosion may be reduced by permitting the power level of the RF bias power to alternate between a low power level (e.g., below $P_B$ where polymer is permitted to deposit above the mask) and a high power level (e.g., above $P_A$ where etching of the underlying layer is increased but erosion of th deposited polymer/mask is also increased). It is also recognized by the inventors herein that the polymer deposited on the mask surface during the low power cycle acts as a sacrificial layer to be eroded away first when the high power cycle resumes. In this manner, erosion of the mask material is reduced even if all of the deposited polymer is etched away at some point during the high power cycle.

It is further recognized by the inventors herein that polymer deposition generally occurs faster on the surface of the mask than at the bottom of the etched feature or along the feature side walls. Since less polymer is deposited along the feature side walls and along the bottom of the etched feature during the low power cycle, the presence of the polymer deposition does not significantly reduce the etch rate at the bottom of the underlying layer or significantly degrade the etch profile (due to excessive side wall deposition). In some cases, it is possible to configure the etch recipe during the low power cycle (e.g., the power level, the duty cycle, the pulse frequency, or the like) such that little or no polymer is deposited at the bottom of the etched feature (or even to have some underlying layer etch) while polymer is deposited above the mask. During the high power cycle, it is preferable that the etch recipe is configured such that substantially all the polymer deposited along the etched feature side wall and at the bottom of the etched feature during the low power cycle be removed so that the etch profile may be preserved and etching through the layer is expedited.

It is crucial that the pulse period be sufficiently low to permit polymer deposition to occur during the low power cycle. If the pulse frequency is too high, e.g., above 1 kHz for most plasma processing systems, polymer deposition may not occur during the low power cycle. While not wishing to be bound by theory, it is believed that polymer deposition does not occur immediately upon the transition from the high power cycle to the low power cycle of the RF bias power wave form. This is because the substrate, the chuck, and the associated electronics have a nontrivial capacitance and a natural ramp down rate when the RF power level changes. Further, ions from the plasma typically have some nontrivial inertia and may take some time to lose their energy (i.e., to reduce the etching mechanism). Accordingly, it typically requires some time after the transition from the high power level to the low power level before polymer deposition occurs on the mask. Thus, unless the pulse frequency is sufficiently slow to permit polymer deposition to occur, merely oscillating the RF bias polymer deposition in the manner so as to improve mask selectivity. This is true even if the duty cycle is kept low during each low power cycle.

FIGS. 7–9 illustrate the effect on the etching and polymer deposition mechanisms at various RF bias power levels on an exemplary substrate stack. In FIG. 7, the RF bias power level is set at zero. In this example, a zero RF bias power level (or very low RF bias power level) causes polymer to be deposited above mask 702, along the side walls of etched feature 704, and along the bottom of the etched feature. However, more polymer tends to be deposited above mask 702 than along the side walls of the etched feature or along the bottom of the etched feature. During the high power cycle, the polymer deposition along the bottom of the etched feature is removed to permit etching of the underlying layer 706 to proceed. The thickness of the deposited polymer along the upper surface of the mask retards erosion of the mask during the high power cycle.

The RF bias power level is higher in FIG. 8 than the RF bias power level of FIG. 7 to depict the etch effect when the RF bias power is raised. In this example, polymer is deposited above mask 702. Due to the higher RF bias power level, however, little if any polymer deposition occurs along the feature side wall and along the bottom of the etched feature during the low power cycle. Further, some etching of the underlying layer may even occur during this low power cycle. As explained earlier in connection with FIG. 6, underlying etch may occur even though polymer continues to be deposited on the mask surface. When the high power cycle resumes, etching at the bottom of the feature continues while the thickness of the deposited polymer along the upper surface of the mask retards erosion of the mask.

In FIG. 9, the RF bias power is even higher than that of FIGS. 7 or 8 to depict the effect during the high power cycle. At a relatively high RF bias power level, there is significant etching through underlying layer 706. If a low power cycle precedes this high power cycle, most (or all) of the polymer deposited during the previous low power cycle is preferably removed. Although some mask material may be removed by the end of the high power cycle, the presence of the deposited polymer at the beginning of the high power cycle reduces the amount of mask material removed during this high power cycle.

To optimize the etch to suit the requirements of a particular substrate stack, the pulse frequency may be varied. In general, decreasing the pulse frequency tends to increase the rate of polymer deposition (and therefore the mask selectivity). To further optimize the etch process, the duty cycle may be varied. In general, increasing the duty cycle tends to decrease mask selectivity. As the duty cycle of the RF bias power wave form approaches the 100% mark, the etch result approaches that of the prior art continuous RF bias wave form.

As mentioned, the high power level may be varied to achieved the desired etch result during the high power cycle. For example, increasing the high power level tends to increase the etch rate and improve the vertical etch profile, albeit at a high mask erosion rate. Likewise, the bottom power level may be varied to achieve the desired balance between the etch mechanism and the polymer deposition mechanism during the low power cycle. For example, increasing the low power level tends to increase the etch rate and reduce the amount of polymer deposition. With reference to FIGS. 7 and 8, increasing the low power level tends to lower line 708. Conversely, reducing the low power level tends to reduce the etch rate, thereby permitting more polymer deposition to occur during the low power cycle. As mentioned before, the low power level may be selected, in some cases, such that little or no polymer deposition occurs at the bottom of the etch feature (thereby minimizing any adverse effect on the etch rate through the underlying layer) while permitting some polymer deposition to occur at the top surface of the mask (to increase mask selectivity during etching).

EXAMPLE

In one specific application, a 200 mm wafer having thereon a dielectric layer, e.g., silicon-dioxide containing layer (e.g., BPSG) is etched in the aforementioned TCP™ 9100 plasma processing system. The mask material represents a photoresist layer and the etchant includes a flurocarbon-containing gas (e.g., a flurocarbon gas or a hydroflurocarbon gas such as $C_2HF_5$). As can be recognized by those skilled in the art, however, the specific etchant chosen depends on the etch recipe chosen and/or the composition of the underlying layer to be etched.

The high RF bias power level is about 1600 watts. However, the high RF bias power level may be optimized to achieve a suitable overall dielectric etch rate, photoresist selectivity, and to maintain the desired etch profile in a given system and/or for a given substrate stack. The high RF bias power level may be between about 600 and about 2500 watts. The low power level may be between about 0 watts to about ½ of the high power level, preferably between about 0 watts to about ⅕ of the high power level. In this example, the low power level is about 150 watts.

The duty cycle may vary between about 10% and any value below 100%, more preferably between about 30% and about 75%. In this example, the duty cycle is about 50%. The pulse period may vary between 0.1 Hz to any value below 1000 Hz, more preferably between about 1 Hz to about 100 Hz and preferably at about 5 Hz.

Also in this example, the pressure within the aforementioned TCP™ 9100 reactor is maintained at about 5 mT during etching. The top power is set at about 1500 watts. In this example, the top RF power is continuous. However, the top RF power may also be paused if desired. Argon is flowed into the processing chamber at about 100 standard cubic centimeters per minute (sccm). However, any suitable substantially nonreactive gas (including, for example, a noble gas or $N_2$) may also be employed. $CHF_3$ is also flowed at about 45 sccm, $C_2HF_5$ is flowed at about 20 sccm, and $CH_2F_2$ is flowed at about 5 sccm. It should be understood, however, that the invention is not limited to the pressure, top power setting, flow rates, and etchant gas composition of the specific embodiment. From this disclosure, one skilled in the art would readily recognize that such parameters may be varied to suit the requirements of a particular plasma processing system and/or a particular substrate.

When the substrate is etched using the disclosed pulsed RF power wave form, photoresist selectivity increases from about 3:1 to about 7:1 without significant adverse impact on the etch profile and/or the etch rate. It is expected that improvements may be obtained even for etches that, when etched with continuous RF power wave forms, already have a higher mask selectivity. The results shows a significant improvement over prior art etches utilizing only continuous RF power wave forms wherein improving mask selectivity, i.e., reducing mask erosion, often results in degraded etch profile and/or reduced overall underlying layer etch rate (and the converse situation wherein improving the etch profile often comes at the expense of mask selectivity, i.e., at the expense of increased mask erosion).

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for reducing erosion of a mask while etching a feature in a first layer underlying said mask, said first layer being disposed on a substrate, said substrate being positioned on a chuck within a plasma processing chamber, comprising:

flowing an etchant source gas into said plasma processing chamber;

forming a plasma from said etchant source gas; and pulsing an RF power source at a predefined pulse frequency, wherein said pulse frequency is between about 5 Hz and about 100 Hz, to provide pulsed Rf power to said chuck, said pulsed RF power having a first frequency and alternates between a high power cycle and a low power cycle at said pulse frequency, said pulse frequency being selected to be sufficiently low to cause polymer to be deposited on said mask during said low power cycle.

2. The method of claim 1 wherein said etchant source gas includes hydrofluorocarbon gas.

3. The method of claim 1 wherein said plasma processing chamber represents an inductively coupled plasma processing chamber.

4. The method of claim 1 wherein a maximum power level during said low power cycle is less than about ½ of a maximum power level during said power cycle.

5. The method of claim 1 wherein said high power level is selected to remove substantially all polymer deposition at a bottom of said feature during said high power cycle.

6. The method of claim 1 wherein said first layer is a dielectric layer.

7. The method of claim 6 wherein said mask is a photoresist mask.

8. The method of claim 7 wherein a maximum power level during said low power cycle is less than about ½ of a maximum power level during said high power cycle.

* * * * *